United States Patent [19]

Dubbelday et al.

[11] Patent Number: 5,330,918
[45] Date of Patent: Jul. 19, 1994

[54] METHOD OF FORMING A HIGH VOLTAGE SILICON-ON-SAPPHIRE PHOTOCELL ARRAY

[75] Inventors: Wadad B. Dubbelday, Spring Valley; Larry D. Flesner; George P. Imthurn, both of San Diego, all of Calif.

[73] Assignee: The United States of America as represented by the Secretary of the Navy, Washington, D.C.

[21] Appl. No.: 938,920

[22] Filed: Aug. 31, 1992

[51] Int. Cl.$^5$ .......................................... H01L 31/18
[52] U.S. Cl. .......................................... 437/2; 437/51; 437/86; 437/225; 437/974; 148/DIG. 12
[58] Field of Search ................ 437/2, 3, 4, 5, 974, 437/86; 148/DIG. 135, DIG. 153, DIG. 12

[56] References Cited

U.S. PATENT DOCUMENTS

| | | |
|---|---|---|
| 4,276,137 | 5/1981 | Hovel et al. . |
| 4,323,719 | 4/1982 | Green . |
| 4,428,110 | 1/1984 | Kim . |
| 4,589,191 | 5/1986 | Green et al. . |
| 4,623,751 | 11/1986 | Kishi et al. ............... 437/51 |
| 4,642,414 | 2/1987 | Rasch et al. . |
| 4,774,194 | 9/1988 | Hokuyou ............... 437/974 |
| 4,837,182 | 6/1989 | Bozler et al. ............ 148/DIG. 135 |
| 4,865,999 | 9/1989 | Xi et al. . |
| 4,872,925 | 10/1989 | McMaster ............... 437/2 |
| 5,110,748 | 5/1992 | Sarma ............... 437/974 |
| 5,164,019 | 11/1992 | Sinton ............... 437/51 |

FOREIGN PATENT DOCUMENTS 1256145  10/1989  Japan ............... 437/974

OTHER PUBLICATIONS

Heterojunction V-Groove Multijunction Solar Cells; pp. 3456-3457, Chappell et al.; IBM Tech. Disc. Bulletin; 23(7B), Dec. 1980.
A Nonconventional approach to thin film cell fabrication; Kirkpatrick et al.; IEEE Photovoltaic Specialists Conf.; Jun. 1978; pp. 1342-1346.

*Primary Examiner*—Brian E. Hearn
*Assistant Examiner*—Michael Trinh
*Attorney, Agent, or Firm*—Harvey Fendelman; Thomas G. Keough; Michael A. Kagan

[57] ABSTRACT

A method is provided for forming a multi-cell photovoltaic circuit on an insulating substrate, comprising the steps of: forming a photovoltaic junction between p-type and n-type layers in a silicon wafer; bonding the silicon wafer to an insulating substrate after forming the photovoltaic junction; patterning the silicon wafer to produce isolated photovoltaic cells; and electrically interconnecting the photovoltaic cells.

7 Claims, 1 Drawing Sheet

METHOD OF FORMING A HIGH VOLTAGE SILICON-ON-SAPPHIRE PHOTOCELL ARRAY

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to a method for manufacturing photovoltaic devices, and more particularly, to a method for fabricating multi-cell photovoltaic devices.

A photovoltaic cell (also synonymously referred to as "photocells.") transforms optical energy into electrical energy and includes a junction between p-type and n-type semiconducting material which separates charge carriers generated by light. This junction is also referred to as a photocell impurity junction. Silicon is a common semiconductor material used in photovoltaic cells. Photovoltaic cells can be connected in series and/or parallel circuits to generate electrical power having various combinations of current and voltage. Typically, photocells are electrically connected in series to create multi-cell photovoltaic arrays.

A method for fabricating multi-cell photovoltaic arrays is described by Routh, et.al. in U.S. Pat. No. 4,156,309. The '309 patent describes the formation of a crystalline layer of silicon on an insulating substrate such as sapphire to fabricate a photocell array. If a photocell array is fabricated on a semiconducting substrate, the maximum voltage which can be obtained from the array is limited by the breakdown voltage of the junctions which isolate the individual photocells from the substrate. For an insulating substrate such as sapphire, the breakdown voltage is several orders of magnitude greater than that of a semiconductor. In accordance with the Routh method, the silicon layer is formed on the sapphire substrate by epitaxial growth, a process involving temperatures of about 950° C., and the photovoltaic p-type to n-type impurity junction is formed by another high temperature process such as diffusion or ion-implantation. Diffusion requires temperatures of about 950° C. and ion implantation requires an activation temperature of at least 850° C. These high temperature processes have been found to cause fractures or defects in the silicon layer resulting from the differential in thermal expansion between the silicon layer and sapphire substrate. The temperature induced defects reduce the power conversion efficiency of the photovoltaic devices.

Therefore, there is a need for a process for manufacturing photocells and circuits employing photocells which does not produce thermally induced defects in the silicon comprising the photocells in order to maximize the energy conversion efficiency of these devices. Moreover, a need exists for a method of manufacturing a photovoltaic circuit capable of generating relatively high voltages, as for example, voltages exceeding 500 volts.

SUMMARY OF THE INVENTION

A method is provided for forming a multi-cell photovoltaic circuit on an insulating substrate, comprising the steps of: forming a photovoltaic junction between p-type and n-type layers in a silicon wafer; bonding the silicon wafer to an insulating substrate after forming the photovoltaic junction; patterning the silicon wafer to produce isolated photovoltaic cells; and electrically interconnecting the photovoltaic cells. The step of bonding the silicon wafer to the insulating substrate after forming the photocell junction layers reduces the formation of thermally induced defects in the silicon wafer which degrade the power conversion efficiency of the photocells.

An advantage of the present invention is to provide a process for manufacturing photocells and circuits employing photocells which does not produce thermally induced defects in the silicon comprising the photocells. The benefit of such a method is to provide photocells with improved energy conversion efficiency. Another advantage of the invention is to provide a method of manufacturing a photovoltaic circuit capable of generating relatively high voltage output power.

DESCRIPTION OF THE PREFERRED EMBODIMENT

Figure 1:
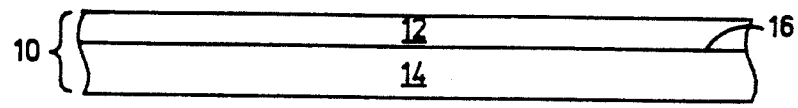
FIGS. 1-7 show cross-sectional views of the several stages in the manufacture of a photovoltaic cell in accordance with various methods of the present invention.

The method of the present invention is described with reference to FIG. 1 which shows silicon wafer 10 comprising a silicon layer 12 formed on a silicon wafer 14. The silicon wafer 14 is doped with impurities to form either an n-type or p-type semiconductor. The layer 12 may be epitaxially grown or formed by ion implantation. For many applications, the layer 12 may be epitaxially grown to a thickness of about 10 microns which is thick enough to substantially absorb incident light. The layer 12 is doped with impurities to form either an n-type or p-type semiconducting material. If the wafer 14 is n-type, then layer 12 is p-type, and vice-versa. By way of example, arsenic may be used to dope the silicon wafer 14 to form n-type material and boron may be used to dope the silicon layer 12 to form p-type material. The concentration of dopant in the wafer 14 is preferably about $10^{19}/cm^3$ or greater which facilitates the formation of ohmic contacts at a later stage in the manufacture of a photovoltaic array. The doping concentration of the layer 12 is typically less than $10^{18}/cm^3$. The dopant concentrations and layer thicknesses are variable parameters which are selected to optimize the photocell power conversion efficiency. A wide range of values for such parameters may provide satisfactory results. The interface 16 between the silicon layer 12 and silicon wafer 14 provides a photovoltaic junction. A photovoltaic junction is a junction between p-type and n-type semiconducting layers which separates light generated charge carriers.

Figure 2:
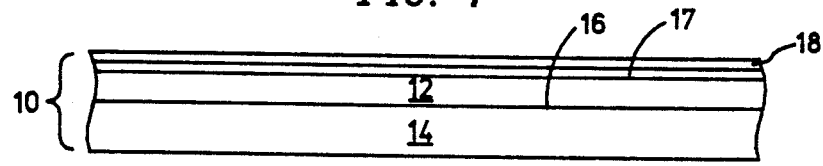

Next, as shown in FIG. 2, a dopant of the same polarity as that of the layer 12 is implanted or diffused into the silicon layer 12 to form a layer 17 which is more heavily doped than the rest of layer 12. For example, if the layer 12 includes n-type material with a doping concentration of about $10^{17}/cm^3$, then the layer 17 may include n-type material with a doping concentration of about $10^{19}/cm$. Such doping facilitates formation of ohmic contacts at a later stage in the manufacture of a photovoltaic cell, as set forth below. The formation of the layer 17 requires subjecting the silicon wafer 10 to a high temperature anneal. Such anneal is required to either promote diffusion if the layer 17 is formed by diffusion, or to activate ion-implanted dopant impurities if the layer 17 is formed by ion-implantation. A silicon dioxide layer 18 is formed on the layer 17 by thermal oxidation to provide a bonding surface, as described below.

By way of example, the thickness of the layer 17 is preferably in the range of about 100 to 500 nm. The ion-implanted dopants are activated by placing the silicon wafer 10 in a high temperature anneal, as for example, in an atmosphere of oxygen maintained at about 900° C. for about 25 minutes, during which time, the silicon dioxide layer 18, which may be about 50 to 100 nm thick, is grown in the layer 17. The silicon dioxide layer 18 is used as a bonding surface because it will adsorb hydroxyl ions which promote bonding between the silicon dioxide layer 18 and an insulating substrate to which the silicon wafer 10 is bonded, as described further herein.

Figure 3:
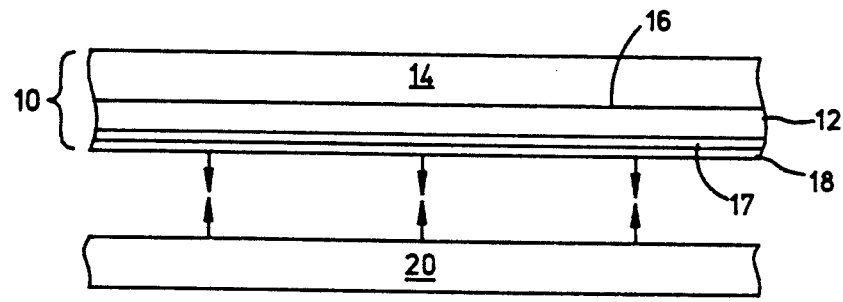

The insulating substrate is preferably a sapphire wafer 20, as shown in FIG. 3, although the insulating substrate may also be made of materials selected from the group consisting of quartz, glass, and silicon dioxide on silicon. The sapphire wafer 20 should be flat and polished to a mirror-like surface on at least one side having an RMS roughness, as for example, of less than 0.25 μm. Preferably, the silicon wafer 10 and sapphire wafer 20 are each approximately of the same size and shape. The surface of silicon dioxide layer 18 is generally smooth enough to bond well with the insulating substrate without polishing, particularly where the insulating substrate is the sapphire wafer 20.

Next, the sapphire and silicon wafers 20 and 10, respectively, are each cleaned, as for example, by a process such as an RCA clean, employing the hydrofluoric acid, hydrogen peroxide, and ammonium hydroxide cleaning, or by a hydrophilization bath using hydrogen peroxide and ammonium hydroxide. After cleaning, the sapphire and silicon wafers are rinsed in de-ionized water, and dried with heated nitrogen. The cleaning results in hydrolyzing, or adsorption of −(OH) ions on the cleaned surfaces which promotes bonding between the sapphire wafer 20 and silicon wafer 10.

The silicon wafer 10 may be placed on a clean surface to expose the layer 18. Then, the polished surface of the sapphire wafer 20 is placed against the exposed surface of the layer 18 of the silicon wafer 10. The silicon wafer 10 and sapphire wafer 20, now in contact with each other, are heated to about 200° C. for a period which may range from 1 to 100 hours in air, nitrogen, or oxygen to create a bonded wafer 22. Generally, the application of pressure to hold the silicon wafer 14 and sapphire wafer 20 together is not necessary, although such compressive force may be provided if desired. The temperature at which the sapphire wafer 20 and silicon wafer 10 are heated is relatively low compared to temperatures employed in processes involving epitaxial growth, ion implantation, and diffusion. Such low temperature advantageously avoids the generation of thermally induced defects associated with the higher temperature processes normally used to grow silicon on sapphire. Thus, a major advantage of the present invention is that it provides a method for manufacturing a photocell on an insulating substrate such as sapphire wafer 20, where after being bonded together, the silicon wafer 10 and the insulating substrate are not subjected to temperatures which would cause the silicon to develop thermally induced cracks. After being allowed to cool to ambient temperature, the bonded wafer 22 may be handled without risk of separating the silicon wafer 10 from the sapphire wafer 20.

Figure 4:
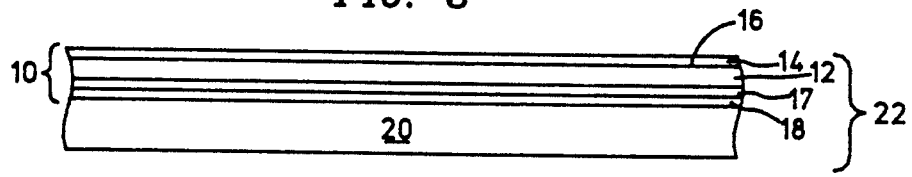

Next, as shown in FIG. 4, the silicon layer 14 may be thinned and thereby transformed into a thinned silicon layer 14 so that only a minimal thickness of about 100 to 1000 nm remains by any of the methods commonly employed in the art of thinning bonded wafers. Such processes may include, but are not limited to surface grinding, precision grinding with electrolytic in-process dressing, or ductile mode grinding.

Figure 5:
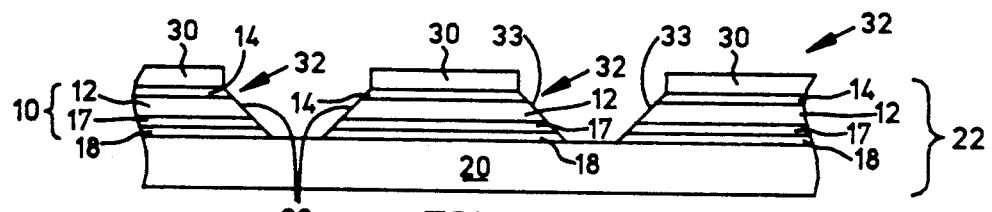

Referring now to FIG. 5, a layer of masking material 30 is deposited onto the surface of the thinned silicon layer 14 and patterned using well known lithographic techniques. An etch, using potassium hydroxide solution (KOH) or an isotropic plasma etch, for example, then may be performed so as to leave islands, now photodiodes 32 of silicon having sloped sidewalls 33 extending from the sapphire substrate 20. After the etch, the masking material 30 is removed. At this stage, the bonded wafer 22 includes an array of photodiodes, or photovoltaic cells 32 which only need to be electrically interconnected in order to complete fabrication of a high voltage photovoltaic cell.

Figure 6:
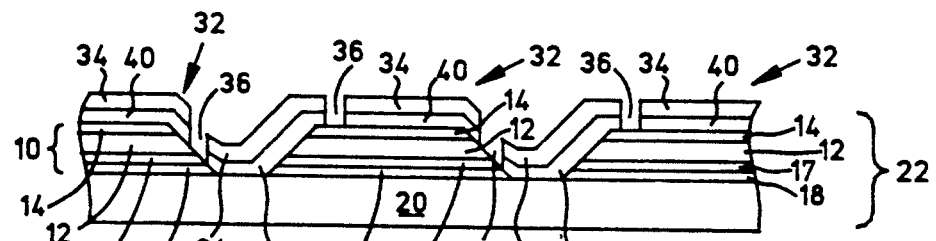

With reference to FIG. 6, a layer of silicon dioxide 40, which is thick enough to provide good electrical insulating properties (500 nm thickness is typically sufficient), is deposited over the photodiodes and exposed surface of the sapphire substrate 20. A layer of photoresist 34 is deposited on top of the layer of silicon dioxide 40, and then patterned using photolithographic techniques. The photoresist 34 serves as a mask for the etching of contact holes 36 in the layer of silicon dioxide 40 to expose selected regions of the silicon layer 17 and thinned silicon layer 14, shown in FIG. 6. Such exposure is facilitated by the sloped sidewalls 33 of the photodiodes 32. After patterning the layer of silicon dioxide 40 to create the contact holes 36, the layer of photoresist 34 is removed by any one of the commonly used methods for removing photoresist.

Figure 7:
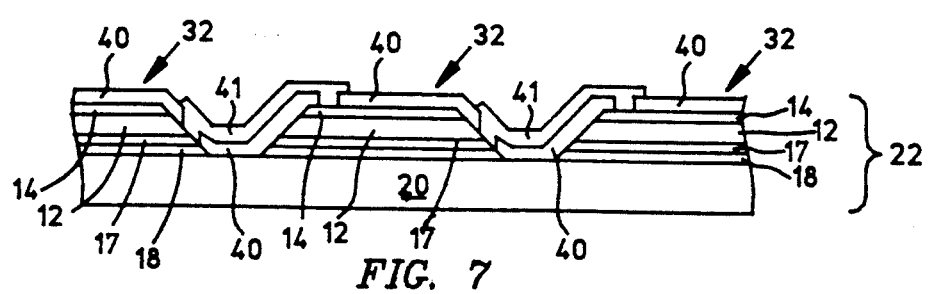

Referring now to FIG. 7, a metallization layer 41 is deposited over the photodiodes 32 and then is suitably patterned using well known photoresist masking methods to create a series circuit photocell array. The photocell array is comprised of multiple, interconnected individual photodiodes, or photocells 32 by interconnecting a heavily doped layer 17 of one photodiode 32 with the thinned silicon layer 14 of another photodiode 32, as shown in FIG. 7. More generally, the individual photocells 32 may be connected in series or parallel as desired by suitably patterning the metal layer 41.

Obviously, many modifications and variations of the present invention are possible in light of the above teachings. It is therefore to be understood that within the scope of the appended claims, the invention may be practiced otherwise than as specifically described.

We claim:

1. A method for forming a multi-cell photovoltaic circuit on an insulating substrate, comprising the steps of:

forming a first silicon layer having a first concentration of a first dopant with a first polarity on a silicon wafer having a second concentration of a second dopant with a second polarity opposite said first polarity to create a photovoltaic junction;

forming a second silicon layer on said first silicon layer, said second silicon layer having a third concentration of a third dopant having said first polarity, where said third concentration is greater than said first concentration of said first dopant;

forming a silicon dioxide layer on said second silicon layer by thermal oxidation;

bonding an insulating substrate to said silicon dioxide layer to create a bonded wafer;

thinning said silicon wafer to form a thinned silicon layer;

etching said bonded wafer to form a plurality of separate photodiodes having sloped sidewalls and to expose selected regions of said insulating substrate;

forming an insulting silicon dioxide layer on said selected regions of said insulating substrate and on said separate photodiodes;

exposing selected regions of said thinned silicon layer and regions of said second silicon layer of each of said photodiodes; and forming metal interconnects between said exposed selected regions of said thinned silicon layer of one of said photodiodes with said second silicon layer of another of said photodiodes.

2. The method of claim 1 wherein said insulating substrate includes a material selected from the group of consisting of sapphire, quartz, glass, and silicon dioxide on silicon.

3. The method of claim 2 wherein the step of bonding includes placing said insulating substrate in contact with said silicon dioxide layer; and then heating said insulating substrate and said silicon dioxide layer to a temperature of about 200° C. for a period which may range from 1 to 100 hours.

4. The method of claim 3 wherein the step of thinning said silicon wafer includes thinning said silicon wafer to a thickness in the range of 100 to 1000 nanometers.

5. The method of claim 3 wherein said first concentration of said first dopant is less than about $10^{18}/cm^3$.

6. The method of claim 3 wherein said second concentration of said second dopant is about $10^{19}/cm^3$.

7. The method of claim 3 wherein said third concentration of said third dopant is about $10^{19}/cm^3$.

* * * * *